United States Patent [19]

Bhagwan

[11] Patent Number: 5,781,055
[45] Date of Patent: Jul. 14, 1998

[54] APPARATUS AND METHOD FOR INSTANTANEOUS STRETCHING OF CLOCK SIGNALS IN A DELAY-LOCKED LOOP MULTI-PHASE CLOCK GENERATOR

[75] Inventor: Raghunand Bhagwan, Sunnyvale, Calif.

[73] Assignee: Sun Microsystems, Inc., Mountain View, Calif.

[21] Appl. No.: 655,835

[22] Filed: May 31, 1996

[51] Int. Cl.$^6$ ............................................. H03K 5/159
[52] U.S. Cl. .......................... 327/270; 327/172; 327/158
[58] Field of Search ........................... 327/157, 158, 327/161, 174, 284, 285, 288, 269–272, 173, 276–278, 281, 295, 299, 172; 331/57, 17

[56] References Cited

U.S. PATENT DOCUMENTS

| | | | |
|---|---|---|---|
| 5,036,216 | 7/1991 | Hohmann et al. | 327/157 |
| 5,066,868 | 11/1991 | Doty, II et al. | 327/284 |
| 5,136,260 | 8/1992 | Yousefi-Elezei | 327/272 |
| 5,469,120 | 11/1995 | Nguyen et al. | 331/57 |
| 5,477,182 | 12/1995 | Huizer | 327/272 |
| 5,563,553 | 10/1996 | Jackson | 327/157 |
| 5,572,159 | 11/1996 | McFarland | 327/281 |
| 5,596,610 | 1/1997 | Leung et al. | 327/288 |
| 5,629,651 | 5/1997 | Mizuno | 327/158 |

OTHER PUBLICATIONS

Efendovich et al., "Multifrequency Zero—Jitter Delay-Locked Loop", *IEEE J. of Solid-State Circuits*, 29(1):67–70 (1994).

Jeong et al., "Design of PLL-Based Clock Generation Circuits", *IEEE J. of Solid-State Circuits*, SC22(2) (1987).

*Primary Examiner*—Timothy P. Callahan
*Assistant Examiner*—Eunja Shin
*Attorney, Agent, or Firm*—Flehr Hohbach Test Albritton & Herbert LLP; William S. Galliani

[57] ABSTRACT

An apparatus and method for instantaneously stretching multi-phase clock signals includes a delay line to generate a plurality of multi-phase clock signals. An instantaneous signal stretch logic circuit is connected to the delay line. The instantaneous signal stretch logic circuit transforms the plurality of multi-phase clock signals into stretched multi-phase clock signals in response to a filter capacitor analog signal and a digital stretch signal. Multiple embodiments of the instantaneous signal stretch logic circuit are disclosed. However, each embodiment includes dual current control paths with a single current control path responsive to the digital stretch signal, which is preferably a single bit value.

7 Claims, 6 Drawing Sheets

APPARATUS AND METHOD FOR INSTANTANEOUS STRETCHING OF CLOCK SIGNALS IN A DELAY-LOCKED LOOP MULTI-PHASE CLOCK GENERATOR

BRIEF DESCRIPTION OF THE INVENTION

This invention relates generally to clock signals that are generated for use by integrated circuits. More particularly, this invention relates to a delay-locked loop multi-phase clock generator that utilizes analog and digital control signals to instantaneously and proportionately stretch multi-phase clock signals during debug and testing of an integrated circuit.

BACKGROUND OF THE INVENTION

The recent trend in microprocessor circuit design is to use dynamic circuits. A dynamic circuit has an output node that is precharged during a precharge phase of a clock cycle. The precharged output node is then evaluated during an evaluation phase of the clock cycle. That is, an input signal is applied to the input node of the dynamic circuit during the evaluation phase and then the output node is evaluated as having either a digital high or a digital low value.

Multi-phase clock signals are used to operate dynamic circuits. Delay-locked loop (DLL) waveform generators can be used to produce the multi-phase clock signals. A DLL is used to produce N equally phase-displaced clock signals.

During diagnostic and debug operations associated with a dynamic circuit, it is desirable to stretch the time-period of the multi-phase clock signals. In other words, sometimes it is necessary to extend the duration of one or more clock cycles generated by the DLL. For example, suppose that it is necessary to extend a clock cycle by a factor of four. In this case, if the clock is running at 600 MHz, then the signal cycle is 1667 ns. If the clock cycle is extended by a factor of four, then the signal cycle must be stretched to a duration of 6.67 ns, and the phase relationship must be maintained proportionately.

The DLL waveform generator must instantaneously produce the stretched signals in all phases. In addition, the proportionality of the signals between phases must be preserved. Moreover, these characteristics must be maintained over process, voltage, temperature, and load variations.

It is known to implement a DLL using completely digital logic. In such an embodiment, digital words are applied to the DLL to control the time period delay of the generated waveforms. This approach requires a relatively large amount of circuitry to process each digital word that is associated with each delay element in a delay line of a DLL. Since this approach is space-intensive and involves quantization error, it is suboptimal.

It is also known to implement a DLL using analog circuitry wherein signal stretching is achieved by varying the charging and discharging of current of the delay cells on a delay line operating in response to a filter capacitor. The problem with an analog DLL of this type is that the filter capacitor must be large enough for stability and to avoid noise coupling. The larger capacitor means slower response time. Thus, an analog DLL tends to have a relatively slow response to a signal stretch command. In other words, an analog DLL does not provide an instantaneous response to a clock stretch command.

In view of the foregoing, it would be highly desirable to provide a multi-phase clock generator that instantaneously responds to a signal stretch command and does not consume excessive die space. Such an embodiment should provide proportionally stretched clock signals over process, voltage, temperature, and load variations.

SUMMARY OF THE INVENTION

An apparatus and method for instantaneously stretching multi-phase clock signals includes a delay line to generate a plurality of multi-phase clock signals. An instantaneous signal stretch logic circuit is connected to the delay line. The instantaneous signal stretch logic circuit transforms the plurality of multi-phase clock signals into proportionally stretched multi-phase clock signals in response to a filter capacitor analog signal and a digital stretch signal. Multiple embodiments of the instantaneous signal stretch logic circuit are disclosed. However, each embodiment includes dual current control paths with a single current control path responsive to the digital stretch signal, which is preferably a single bit value, but may be a multiple bit value.

The invention has a digital control mechanism that instantaneously responds to the digital stretch signal. Moreover, while the circuit of the invention provides digital speed and analog resolution (without digital quantization errors), it does not consume large amounts of area, as in the case of a completely digital delay-locked loop. The invention maintains signal proportionality over process, voltage, temperature, and load variations.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
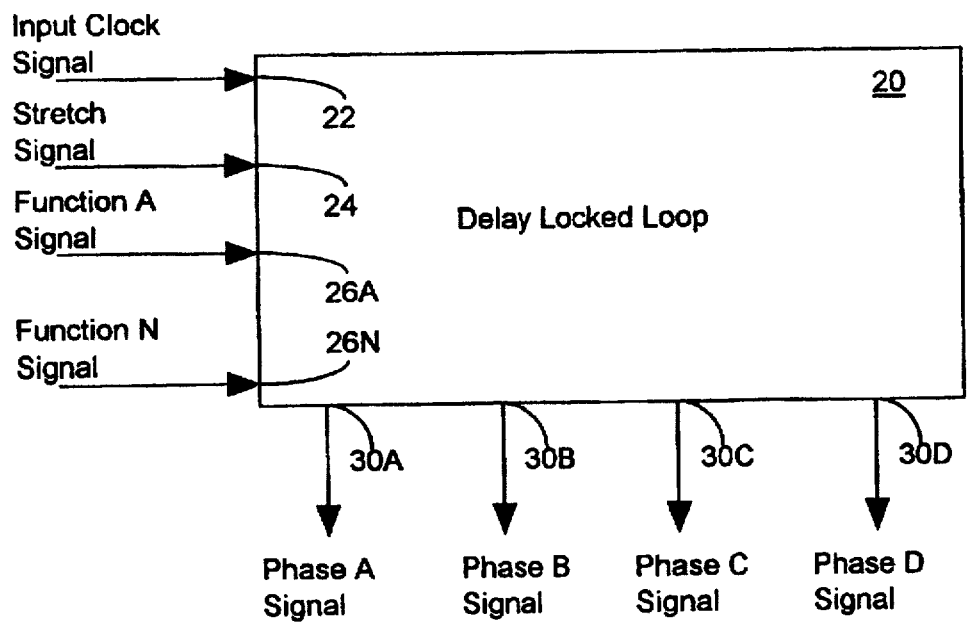
FIG. 1 is a general illustration of a delay-locked loop.

FIG. 1 is a general illustration of a delay-locked loop multi-phase clock generator 20 in accordance with an embodiment of the invention. The delay-locked loop (DLL) 20 has an input node 22 to receive an input clock signal, an input node 24 to receive a clock stretch command signal, and an additional set of nodes 26A–26N to receive different types of functional signals. For instance, one functional signal might be an energy star energy conversation signal and another might be a feedback signal. As illustrated in the figure, the DLL 20 generates a set of output signals.

By way of example, the DLL 20 includes tapped output nodes 30A–30D, respectively carrying a set of multi-phase clock signals referred to as a phase A signal, a phase B signal, a phase C signal, and a phase D signal.

Figure 2:
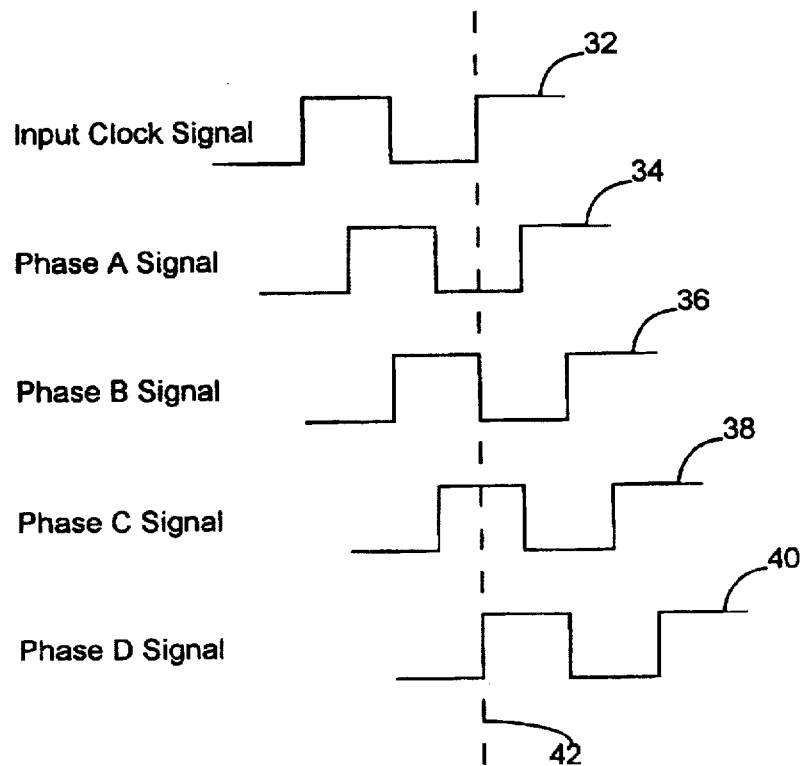
FIG. 2 illustrates a set of waveforms generated by a delay-locked loop.

FIG. 2 illustrates an example input clock signal and output multi-phase clock signals processed by the DLL 20. In the figure, waveform 32 is an example input clock signal. A typical dynamic logic clock signal will have a digital low duty cycle of approximately 30% of the cycle time and a digital high duty cycle of approximately 70% of the cycle time. The waveform 32 is simplified to have even duty cycles between the digital low and digital high values.

The DLL 20 generates waveform 34, which is ninety degrees phase-displaced from the input clock signal waveform 32. Similarly, the DLL 20 generates waveform 36, which is one hundred-eighty degrees phase-displaced from the input clock signal waveform 32. The phase C signal waveform 38 is two hundred-seventy degrees phase-displaced from the input clock signal waveform 32.

Finally, the phase D signal waveform 40 is three hundred and sixty degrees phase-displaced from the input clock signal waveform 32. Line 42 illustrates that the phase D signal waveform 40 transitions high as the input clock signal begins another cycle. Thus, FIG. 2 illustrates four phase-displaced multi-phase clock signals generated by a DLL 20. The phase-displacement between signals can be quantified as 360/N, where N is the number of signals. Since N equals four in FIG. 2, each signal is phase-displaced by ninety degrees.

Figure 3:
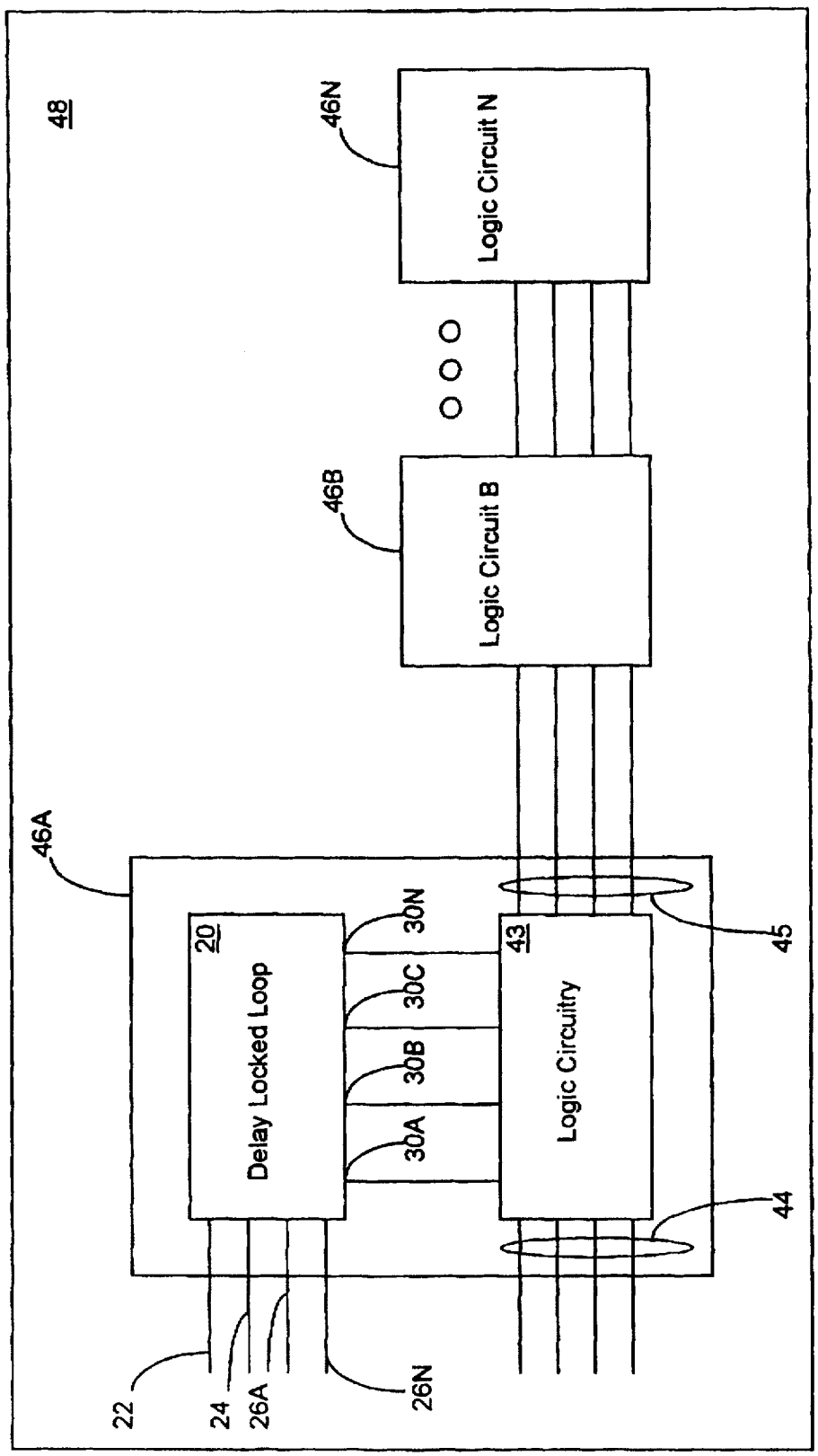
FIG. 3 illustrates a circuit board of a general purpose computer including a logic circuit utilizing the delay-locked loop of the invention.

FIG. 3 illustrates the DLL 20 forming a portion of a logic circuit 46A, which by way of example is a microprocessor. The multi-phase clock signals generated by the DLL 20 are conveyed to logic circuitry 43 via the output nodes 30A–30N. The logic circuitry 43 is dynamic logic circuitry that uses the multi-phase clock signals in a known manner. FIG. 3 also illustrates that the logic circuit 46A is positioned on a circuit board 48, for example a mother board of a general purpose computer. The circuit board 48 includes other logic circuits 46B–46N, which are electrically connected to the logic circuit 46A. The circuit board 48 may be substituted for a multi-chip module.

Figure 4:
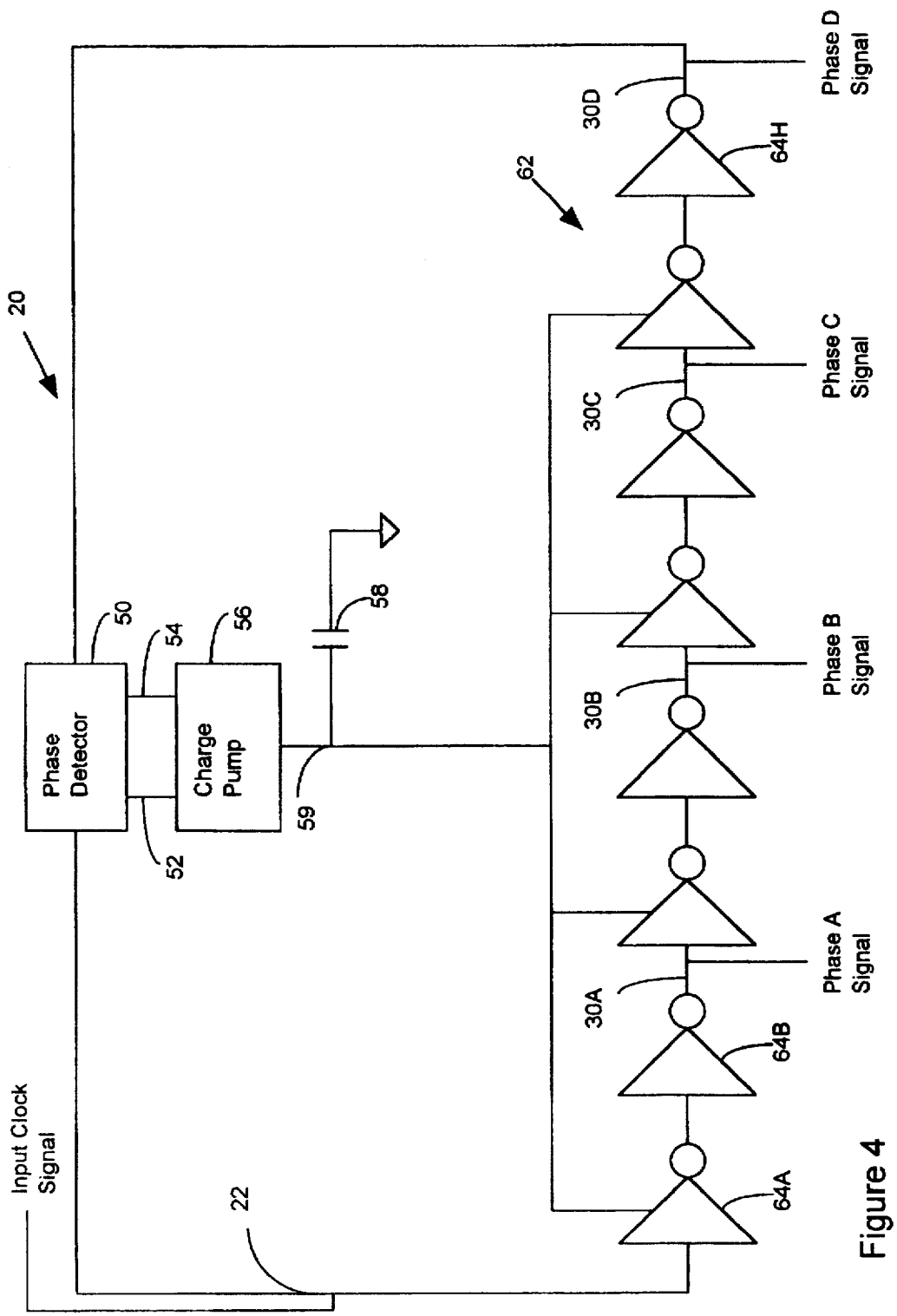
FIG. 4 is a schematic view of a delay-locked loop in accordance with an embodiment of the invention.

FIG. 4 illustrates an analog DLL 20 that may be used in connection with the invention. The circuit of FIG. 4 includes an input node 22 to receive an input clock signal. The input clock signal is conveyed to a phase detector 50. The phase detector 50 also receives the phase D signal from the output node 30D. As illustrated in FIG. 2, the rising edge of the phase D signal waveform 40 should coincide with the rising edge of the next input clock signal. The phase detector 50 identifies any phase discrepancy between these two signals. Based upon the phase relationship identified by the phase detector 50, the phase detector 50 generates a charge up signal on line 52 or a charge down signal on line 54. The charge pump 56 processes one signal or the other to change the charge or voltage level on the filter capacitor 58.

The output node 59 of the filter capacitor 58 is connected to a delay line 62. The delay line 62 comprises a set of serially connected signal delay elements 64A–64H with tapped output nodes 30A–30D. The tapped output nodes 30A–30D carry the multi-phase clock signals generated by the delay line 62. Commonly, the multi-phase clock signals are generated by combining the signals from the tapped output nodes 30A–30D with other signals. For example, a logical OR gate may be used to combine a signal from the input node 22 and the tapped output node 30A to generate the phase A signal. Similarly, a logical OR gate may be used to combine a signal from the tapped output nodes 30A and 30B. To simplify the discussion herein, the tapped output nodes 30A–30D are said to carry the multi-phase clock signals. However, it should be appreciated that this statement contemplates the use of the signals on the tapped output nodes 30A-30D in combination with other signals to produce the multi-phase clock signals.

In the embodiment of FIG. 4, the signal delay elements 64A–64H are inverters. The inverters may be considered to contain groups of phase delay elements, each of which has a selected tapped output node 30. For example, inverters 64A and 64B form a group of phase delay elements with a selected tapped output node 30A, carrying a phase A signal.

The filter capacitor 58 is electrically connected to selected signal delay elements 64. The invention is disclosed by showing the filter capacitor 58 connected to alternate signal delay elements 64. Connections can be made to each signal delay element 64, or other connection schemes may be used in accordance with the invention.

The voltage on the filter capacitor 58 determines the delay associated with the connected signal delay elements 64. Thus, the signal delay elements 64 are said to be voltage variable delay buffers. As indicated above, a problem with a capacitor voltage controlling the delay of voltage variable delay buffers is the relatively slow response time.

Figure 5:
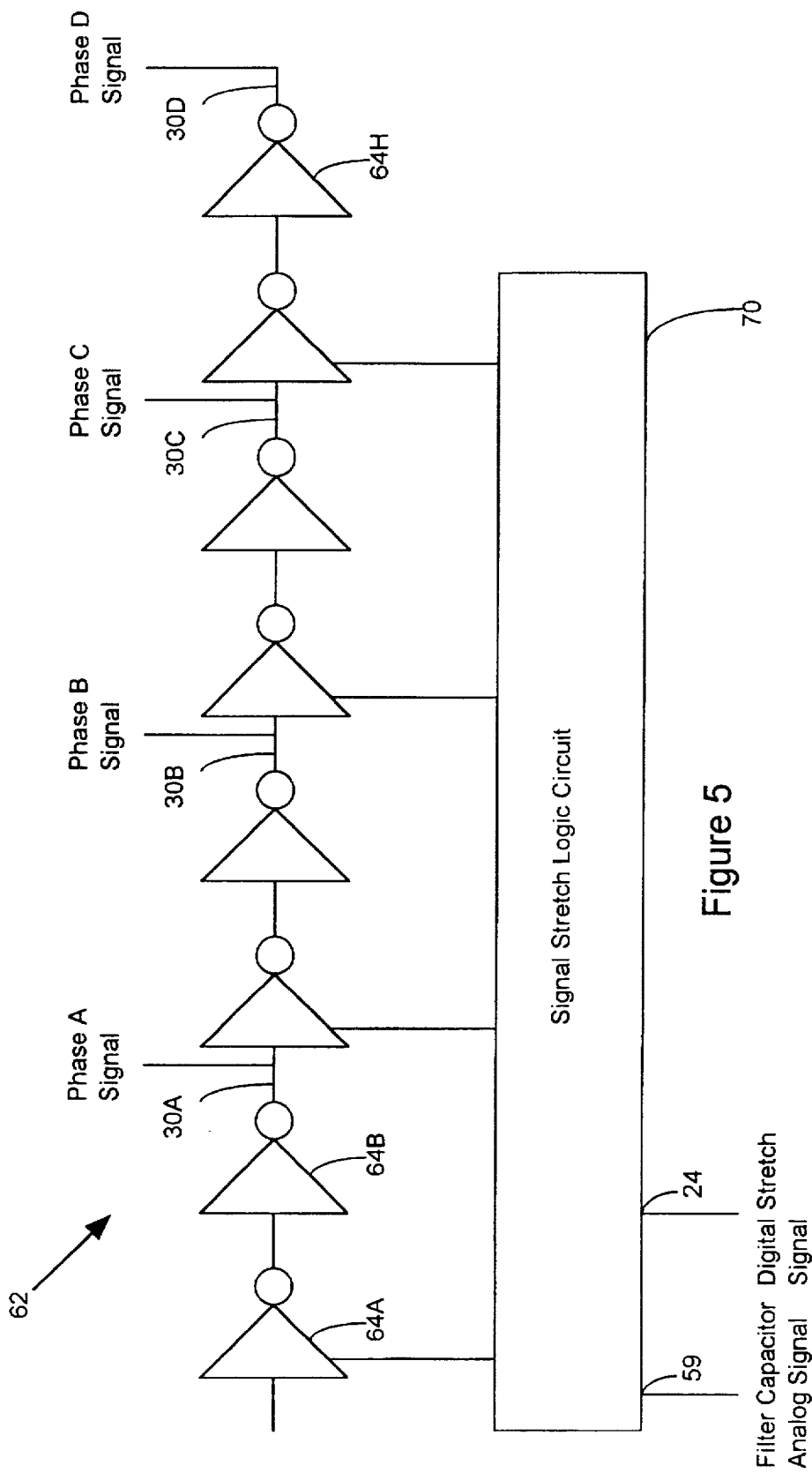
FIG. 5 illustrates a delay line and a signal stretch logic circuit in accordance with an embodiment of the invention.

FIG. 5 illustrates a portion of the DLL 20 of FIG. 4. In particular, FIG. 5 illustrates the delay line 62 of FIG. 4. In addition, the figure illustrates an instantaneous signal stretch logic circuit 70 connected to the delay line 62. The instantaneous signal stretch logic circuit 70 processes the filter capacitor analog signal from node 59 (of FIG. 4) and a digital stretch signal from node 24 (of FIG. 1). As will be described below, the instantaneous signal stretch logic circuit 70 uses the digital stretch signal, typically a single bit signal, to modify the delay of the signal delay elements 64. That is, the digital stretch signal is used to modify the delay of the signal delay elements 64 and thereby achieve the requisite clock signal stretch for use during diagnostic and debug operations. As will be described below, the circuit of the invention achieves instantaneous signal stretch in response to a digital signal. Thus, the circuit of the invention is faster than a completely analog device. Moreover, it does not have the large space requirements of a completely digital device.

Figure 6:
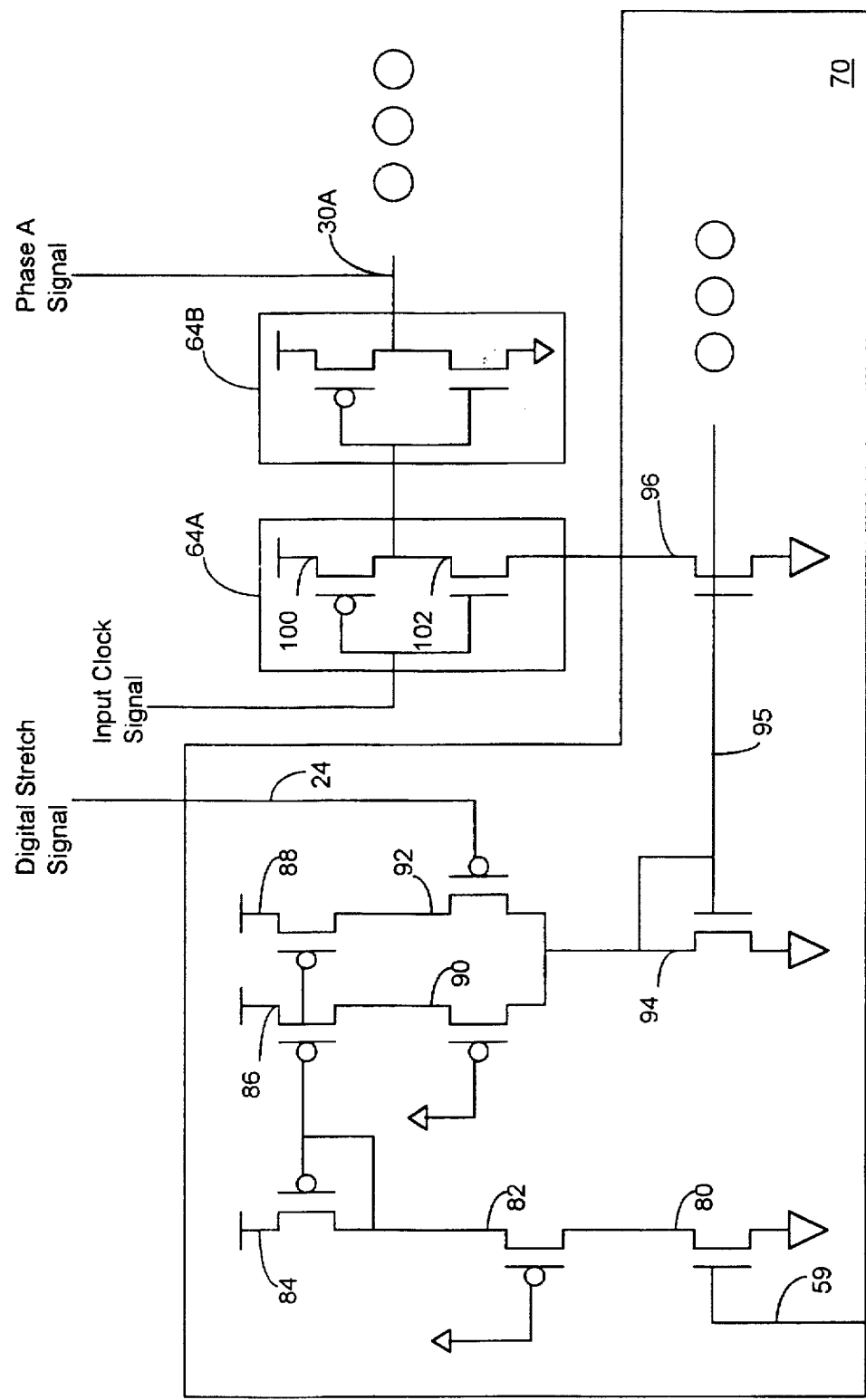
FIG. 6 illustrates one embodiment of a signal stretch logic circuit that utilizes a central bias circuit.

FIG. 6 illustrates an embodiment of the instantaneous signal stretch logic circuit 70 of the invention. The instantaneous signal stretch logic circuit 70 operates as a current control circuit. That is, by controlling the charging and discharging current associated with the signal delay elements 64A-64H, the delay of the signal delay elements is controlled. The amount of current controlled by the instantaneous signal stretch logic circuit is inversely proportional to the delay produced by the signal delay elements 64A-64H. That is, less current means more delay, and more current means less delay.

Selected signal delay elements 64 have corresponding delay element control circuits in the instantaneous signal stretch logic circuit 70. For example, signal delay element 64A has a corresponding delay element control circuit 96. In the embodiment of FIG. 6, the delay element control circuit 96 is implemented as a single NMOS transistor. The NMOS transistor 96 receives a gate signal that is developed by a central bias circuit comprising transistors 80–94. As will be described below, the central bias circuit processes the filter capacitor analog signal and the digital stretch signal to generate a gate signal that modifies the current draw provided by the delay element control circuit 96. For example, a large voltage signal at the gate (node 95) of NMOS transistor 96 will turn the transistor on strongly, allowing a large amount of current to be rapidly drawn from the signal delay element 64A. As a result, an input clock signal experiences a relatively small amount of delay through the signal delay element 64A. Conversely, a small voltage signal at the gate of NMOS transistor 96 will turn the transistor on slowly, resulting in a small amount of current slowly drawn from the signal delay element 64A. This results in a relatively large amount of signal delay through the signal delay element 64A.

The signal delay element 64A of FIG. 6 is illustrated as a complementary static logic inverter including pull-up PMOS transistor 100 and pull-down NMOS transistor 102. The current control operation of the instantaneous signal stretch logic circuit 70 is equally applicable to other embodiments of signal delay elements.

The general current control phenomenon utilized by the instantaneous signal stretch logic circuit 70 has now been described. Attention presently turns to one technique for generating an appropriate current control signal from the filter capacitor analog signal and the digital stretch signal. As indicated above, the embodiment of FIG. 6 includes a central bias circuit with transistors 80–94.

Transistor 80 is connected to the filter capacitor 58 (of FIG. 4) via node 59. A relatively large voltage on the filter capacitor will produce more current and ultimately less delay for the signal delay elements 64. The converse is also true. This operation can be described as follows.

A relatively large voltage on the filter capacitor 58 will cause the transistor 80 to turn-on strongly, drawing more current. PMOS transistor 82 is tied to ground so that it is normally on. Transistor 84–88 form a current mirror network. Thus, a larger current flow through the leg defined by transistors 80 and 82 results in a larger current flow in the leg defined by transistor 90 and 92, which subsequently results in a larger current flow through transistor 94 and on node 95.

Note that the central bias circuit includes a dual current control path. That is, current passes through one path comprising transistor 90 and another path comprising transistor 92. Transistor 90 is a PMOS transistor with its gate tied to ground, so it is normally on. Transistor 92 is a PMOS transistor with its gate tied to the digital stretch signal node 24. Typically, a digital stretch mode will not be used, thus, transistor 92 is typically on.

The foregoing discussion describes how the filter capacitor analog signal at node 59 results in a signal that effects the delay of the signal delay element 64A (and any other signal delay element connected to node 95). Thus, it can be appreciated that the instantaneous signal stretch logic circuit 70 of the invention has an analog control aspect to it. The invention also has a digital control aspect to it. Namely, when the digital stretch signal is asserted (digital high) on node 24, transistor 92 shuts-off. This reduces the current flow to node 95. As a result, the current drawn through transistor 96 is reduced and the delay at signal delay element 64A is increased.

Thus, in accordance with the invention, a single current control path (through transistor 92) of the dual current control path (comprising transistor 90 and 92) is modulated to control the delay of the signal delay elements 64. The amount of delay can be controlled by sizing the transistors 90 and 92 appropriately. For example, the current in transistors 94 and 96 (or any other transistor connected to node 95) is reduced by a ratio of $W_{86}/(W_{86}+W_{88})$, where $W_{86}$ and $W_{88}$ are the widths of transistors 86 and 88. As indicated above, the reduction in current through transistor 96 means an increased delay at signal delay element 64A. The delay is increased by a factor of $(W_{86}+W_{88})/W_{86}$.

Note that with the present invention, the digital stretch signal is applied to only one transistor (92). Thus, signal clock stretch is achieved through single bit digital control. In addition, since the filter capacitor 58 is isolated from the switching activity of the delay line 62, it experiences less noise coupling.

Figure 7:
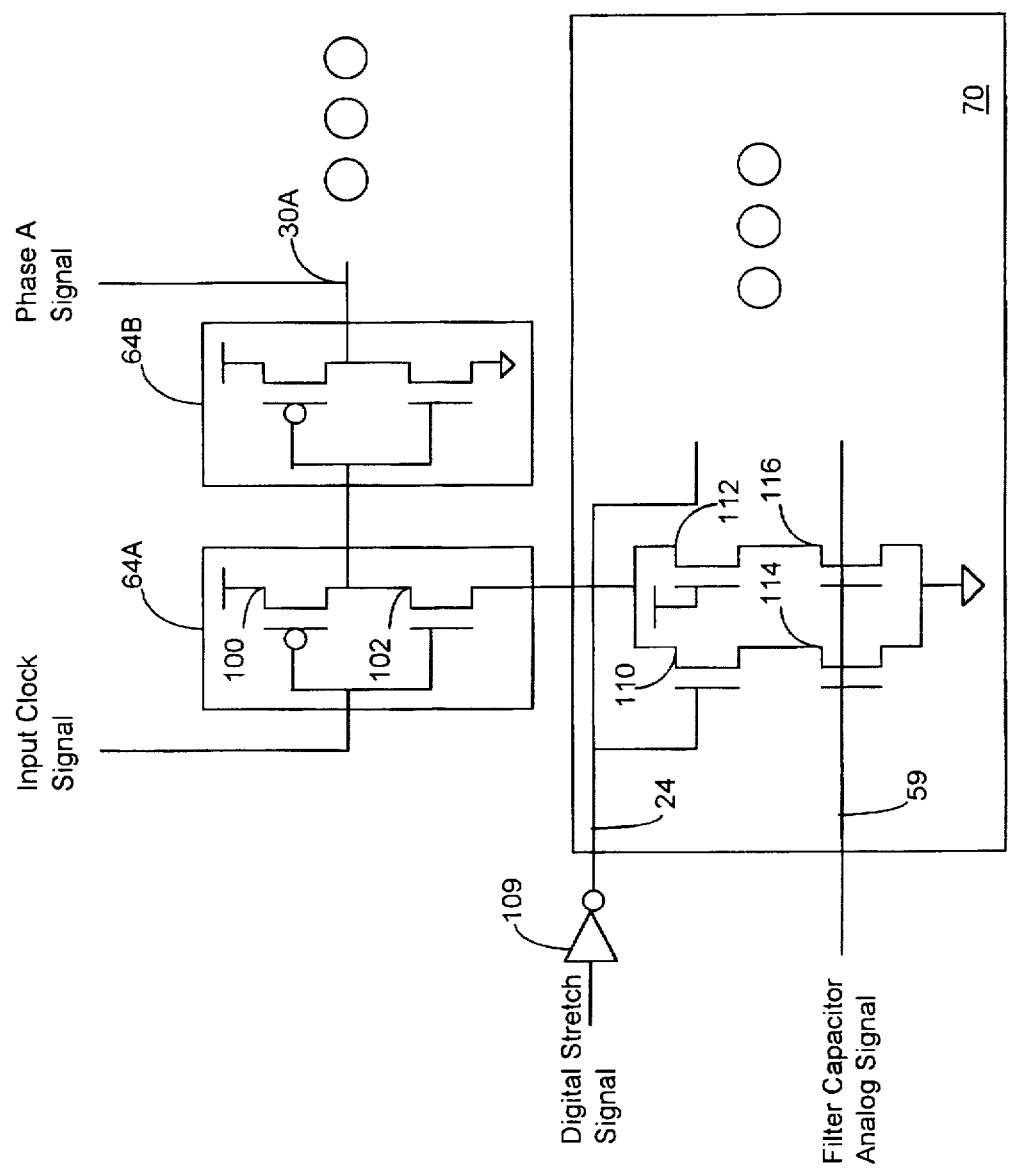
FIG. 7 illustrates an embodiment of a signal stretch logic circuit that utilizes local bias circuits.

FIG. 7 illustrates an alternate embodiment of the instantaneous signal stretch logic circuit 70 of the invention. The embodiment of FIG. 7 utilizes a plurality of local current bias circuits. The signal delay element 64A has a local current bias circuit comprising transistors 110 and 112. The instantaneous signal stretch logic circuit 70 also includes a set of delay element control circuits. In the embodiment of FIG. 7, a single delay element control circuit is shown comprising transistors 114 and 116. The filter capacitor analog signal on node 59 is applied to the gates of transistors 114 and 116. Thus, as in the case of the embodiment of FIG. 6, there is an analog control aspect to the circuit of the invention. This analog control aspect is modified by the digital stretch signal on node 24.

The local bias circuit comprising transistors 110 and 112 includes a first current control path through transistor 110 and a second current control path through transistor 112. The gate of transistor 112 is tied to Vdd so it is normally turned-on. The gate of transistor 112 is coupled to the digital stretch signal node 24. In typical operation, the digital stretch signal is not asserted. The inverter 109 therefore produces a digital high signal that turns on the NMOS transistor 110. However, when the digital stretch signal is asserted (with a digital high signal), the transistor 110 is turned-off, shutting off the current through the current control path provided by transistor 110. The reduction in current results in more delay for the signal delay element 64A. As in the case of the previous embodiment, the delay is increased by a factor of $(W_{114}+W_{116})/W_{116}$, where $W_{114}$ is the width of transistor 114 and $W_{116}$ is the width of transistor 116. Similarly, as in the previous embodiment, the current is reduced by a factor of $W_{116}/(W_{114}+W_{116})$.

Sometimes during the stretch operation the input signal at node 22 will not be stretched but the signal at node 30D will be stretched. In this case, the phase detector 50 is disabled to prevent spurious correction signals from being applied to the filter capacitor 58.

Those skilled in the art will appreciate the numerous benefits of the disclosed technology. For example, the invention has an analog control mechanism that instantaneously responds to a digital stretch signal. Thus, the invention is faster than analog delay-locked loops. Moreover, while the circuit of the invention provides digital control and analog resolution, it does not consume large amounts of area, as in the case of a completely digital delay-locked loop. By adjusting the analog voltage on the filter capacitor, the delay of the circuit may be adjusted to be equal to the incoming clock period over process, voltage, load, and temperature variations.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following Claims and their equivalents.

I claim:

1. An apparatus for instantaneously stretching multi-phase clock signals, comprising:
   a delay line to simultaneously generate a plurality of multi-phase clock signals said delay line comprising a plurality of serially connected clock signal delay elements, each clock signal delay element of said plurality of serially connected clock signal delay elements creating a predetermined delay in response to a clock signal delay control current, said plurality of serially connected clock signal delay elements having a plurality of tapped output nodes positioned therebetween for carrying said plurality of multi-phase clock signals; and
   a signal stretch logic circuit connected to said delay line, said signal stretch logic circuit including a plurality of delay element control circuits connected to said plurality of serially connected clock signal delay elements each delay element control circuit of said plurality of delay element control circuits controlling said clock signal delay control current of an associated clock signal delay element of said plurality of serially connected clock signal delay elements each of said delay element control circuits being connected to a dual current control path with a first current control path controlled by a filter capacitor analog signal and a second current control path controlled by a digital stretch signal, such that said filter capacitor analog signal and said digital stretch signal transform said plurality of multi-phase clock signals into stretched multi-phase clock signals.

2. The apparatus of claim 1 wherein said plurality of serially connected clock signal delay elements are divided into groups of phase delay elements, each group of phase delay elements including two inverters and a selected tapped output node of said plurality of tapped output nodes.

3. The apparatus of claim 1 wherein said dual current control path forms a portion of a central bias circuit.

4. The apparatus of claim 3 wherein said central bias circuit includes a current mirror network to process said filter capacitor analog signal.

5. The apparatus of claim 1 wherein said digital stretch signal is a single bit digital signal.

6. The apparatus of claim 1 further comprising logic circuitry connected to said delay line, said logic circuitry forming a microprocessor.

7. The apparatus of claim 6 further comprising a circuit board of a general purpose computer attached to said microprocessor.

* * * * *